United States Patent
Dallabora et al.

(10) Patent No.: US 6,195,290 B1
(45) Date of Patent: Feb. 27, 2001

(54) METHOD OF AVOIDING DISTURBANCE DURING THE STEP OF PROGRAMMING AND ERASING AN ELECTRICALLY PROGRAMMABLE, SEMICONDUCTOR NON-VOLATILE STORAGE DEVICE

(75) Inventors: Marco Dallabora, Carpiano; Corrado Villa, Sovico; Simone Bartoli, Pisa; Marco Defendi, Sulgiate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/407,135

(22) Filed: Sep. 27, 1999

Related U.S. Application Data

(62) Division of application No. 08/775,110, filed on Dec. 30, 1996, now abandoned.

(30) Foreign Application Priority Data

Dec. 29, 1995 (EP) .................................................. 95830553
Apr. 30, 1996 (EP) .................................................. 96830245

(51) Int. Cl.⁷ .................................................. G11C 11/34
(52) U.S. Cl. .................................. 365/185.22; 365/185.19
(58) Field of Search ........................ 365/185.22, 185.29, 365/218, 185.19

(56) References Cited

U.S. PATENT DOCUMENTS

| | | | |
|---|---|---|---|
| 4,763,305 | * 8/1988 | Kuo | 365/200 |
| 5,291,446 | 3/1994 | Van Buskirk et al. | 365/189.09 |
| 5,444,412 | 8/1995 | Kowalski | 327/541 |
| 5,463,586 | 10/1995 | Chao et al. | 365/210 |
| 5,511,026 | 4/1996 | Cleveland et al. | 365/189.09 |
| 5,642,309 | 6/1997 | Kim et al. | 365/185.22 |

FOREIGN PATENT DOCUMENTS

| | | |
|---|---|---|
| 0 432 481 A2 | 6/1991 | (EP) . |
| WO 90/12400 | 10/1990 | (WO) . |
| WO 96/08840 | 3/1996 | (WO) . |

OTHER PUBLICATIONS

"Developments in Programming Flash at 3V" *Electronic Engineering*, 65(798):62,65–66, Jun. 1993.

\* cited by examiner

*Primary Examiner*—A. Zarabian
(74) *Attorney, Agent, or Firm*—Theodore E. Galanthay; E. Russell Tarleton; Seed IP Law Group

(57) ABSTRACT

A method of avoiding disturbance during the step of programming and erasing an electrically programmable, semiconductor integrated non-volatile memory device which includes a matrix of memory cells divided into sectors and programmable in a byte mode is disclosed. An operation of verification of the contents of the byte to be programmed, to be carried out for each individual bit, is provided even before the first program pulse is applied. The method also provides for the parallel erasing of several sectors during an erase step, and a verification of the erase step for each sector in the matrix. If the verification shows that a sector has been erased, the sector is applied no further erase pulses.

10 Claims, 3 Drawing Sheets

METHOD OF AVOIDING DISTURBANCE DURING THE STEP OF PROGRAMMING AND ERASING AN ELECTRICALLY PROGRAMMABLE, SEMICONDUCTOR NON-VOLATILE STORAGE DEVICE

CROSS-REFERENCE TO RELATED APPLICATION

This application is a division of pending U.S. patent application Ser. No. 08/775,110, filed Dec. 30, 1996.

TECHNICAL FIELD

This invention relates to a method of avoiding disturbance during the step of programming and erasing an electrically programmable semiconductor non-volatile memory device.

More particularly, the invention relates to a method for application in a semiconductor integrated non-volatile memory device having a single power supply and comprising a matrix of memory cells divided into sectors, and being programmable electrically in a byte mode, but the considerations made hereinafter would equally apply to any other type of flash memory, including flash memories with dual power supplies.

As is well known, read-only memories of the flash type, although non-volatile, allow information contained therein to be modified electrically during the write or program step and the erase step.

Memories of this type are constructed as matrices of cells arranged into rows, or word lines, and columns, or bit lines. Each cell comprises a floating gate transistor having a drain region and a source region formed on a semiconductor substrate and isolated by a channel region. The floating gate is formed over the substrate and isolated from the latter by a thin layer of gate oxide.

A control gate is coupled capacitively to the floating gate through a dielectric layer, and metallic electrodes are provided for contacting the drain, source, and control gate, in order to have predetermined voltage values applied to the memory cell.

Cells in the same word line have the electric line in common which drives their respective control gates, while cells in the same bit line have the drain terminals in common.

BACKGROUND OF THE INVENTION

When suitable voltage values are applied to a cell terminal, the cell state can be altered by changing the amount of the charge present at the floating gate. The operation whereby charge is stored into the floating gate is called "programming", and consists of biasing the control gate and drain terminal at a predetermined value higher than the electric potential of the source terminal.

For example, each individual cell can be programmed by a electron injection process that allows electrons to become trapped within the floating gate when the control gate is applied a relatively high voltage, Vg, in the 9 to 12V range. Concurrently, the source terminal is connected to ground and the drain terminal is biased at a voltage Vb in the 4 to 7V range.

The programming of a flash memory can be performed either by the sector (page mode) or the byte (byte mode). In the former case, all the cells in one row of the matrix are addressed simultaneously. In the latter case, a single byte of the many available in one row is addressed.

The use of positive voltages Vg and Vb with relatively high values poses more than one problem from the standpoint of possible disturbance to cells adjacent to those being programmed, such as those cells in the same bit line which are not to be programmed and have their control gates connected to ground.

This phenomenon may result in spurious erasing of the stressed cells. In all cases, programming noise is apt to make retention of the charge after prolonged read cycles less secure.

It is a primary object of the present invention to solve this problem.

Another problem occurs when erasing memory cells. To erase a flash memory cell, use is made of Fowler-Nordheim's tunneling effect. The source terminal is applied a voltage approximating the program voltage, and the drain terminal is kept floating, while the control gate is connected to ground or to a negative voltage reference.

Erasing can be performed by the individual sector or by multiple sectors, just as programming can. However, the erase time is a function of the number of write and erase cycles that have involved the various sectors of the flash memory, and grows with the age of the individual sector. This means essentially that various sectors of the memory device get old at different times, i.e. at different aging stages according to the number of write/erase cycles to which they have been subjected.

As an example, there may be some sectors in one device which have gone through 50 program/erase kilocycles, and others that have gone through less than ten such cycles. The concurrent erasing of several sectors having different ages may place serious problems on the youngest sectors, which would then be subjected to the erase voltages needed to have the oldest sectors erased for a longer time than is necessary.

The underlying technical problem of this invention is to provide a method of preventing, both during the programming and the erasing step, disturbance of an integrated memory device as previously indicated. This method has performance characteristics which extend the useful life of the memory device and overcome the drawbacks of state-of-art programming and erasing techniques.

SUMMARY OF THE INVENTION

The solutive idea on which this invention stands is one of carrying out a verify operation on a byte to be programmed, prior to it being applied the first program pulse. In particular, this idea provides a break in the rising transient of the drain voltage Vb for reading the byte to be programmed.

The features and advantages of a method according to the invention will be apparent from the following detailed description of an embodiment thereof, given by way of non-limitative example with reference to the accompanying drawings.

DETAILED DESCRIPTION OF THE INVENTION

Referring to the figures, the method of this invention for preventing disturbance during the programming/erasing of an electrically programmable semiconductor non-volatile memory device will now be described.

The inventive method is particularly, but not exclusively, intended for a single power supply integrated memory device which comprises a matrix of memory cells having multiple sectors and respective device-resident program/erase algorithms.

Each memory cell comprises a floating gate MOS transistor having an additional control gate. The cells are organized as rows or word lines, and columns or bit lines. The cells of one word line share the electric line driving their respective control gates, while the cells in one bit line having their drain terminals in common.

The method of this invention is particularly, but not solely, useful with a flash memory having a single power supply at a supply voltage Vcc of 5V. The invention has been applied to a memory implemented with double-well technology and erased by a negative voltage to the cell gates.

The cell matrix is a four-Mbyte matrix divided into eight sectors of 512 kbytes each, with memory words of sixteen bits.

Figure 1:
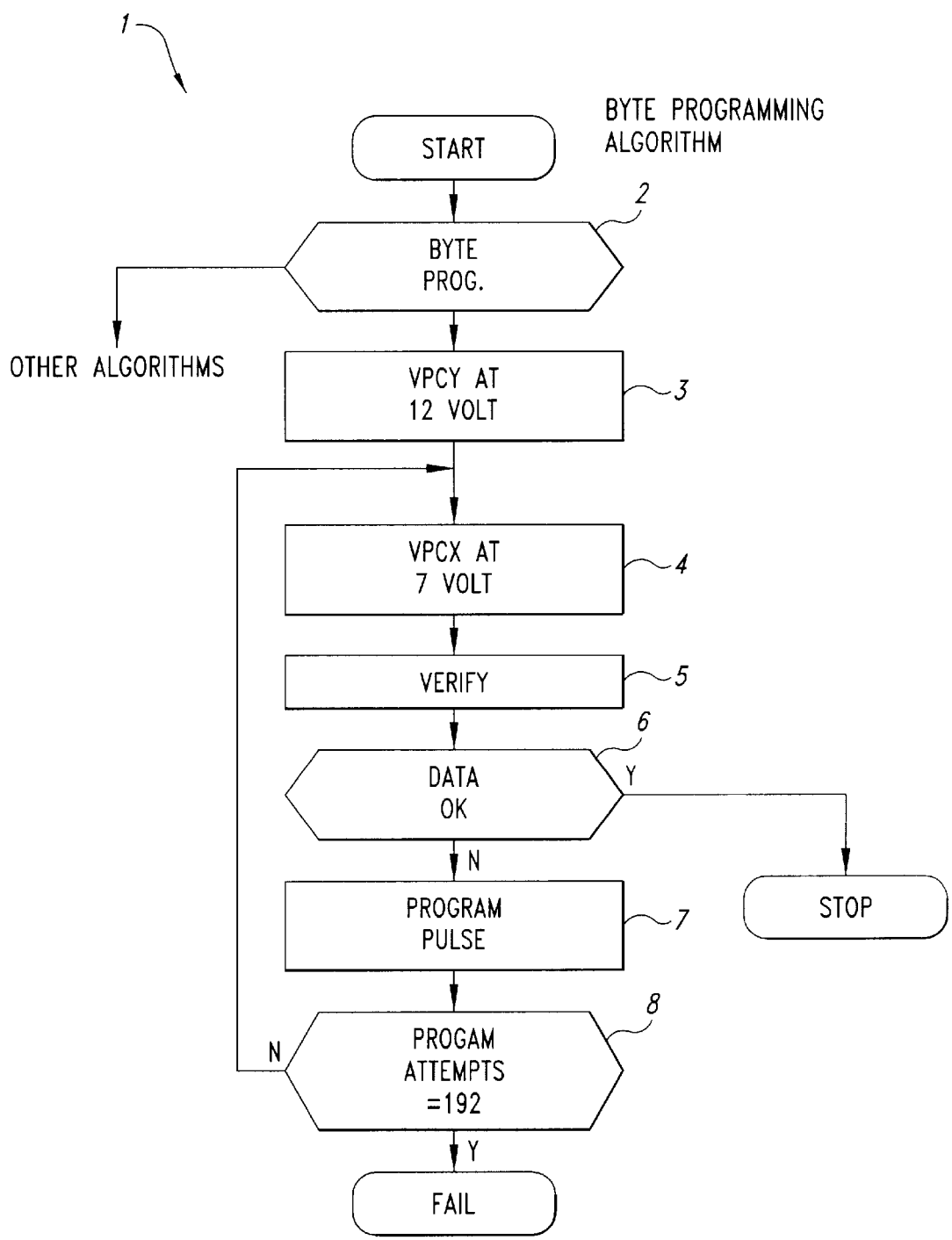
FIG. 1 is a diagrammatic representation of an algorithm for implementing a byte programming mode in accordance with the method of this invention.

Shown in FIG. 1 is a flow chart for a program algorithm 1 used in practicing the inventive method. This algorithm 1 includes a starting step START directly followed by a test step 2 for ascertaining the need to have a byte of the memory device programmed.

If this test step 2 fails (N), the algorithm 1 is interrupted, and control is transferred onto other algorithms. Otherwise, the procedure continues and the programming voltage Vpcy which is to be applied to the i-th column of the matrix memory being programmed rises to 12V. This step is illustrated by block 3. The programming voltage Vpcy attains a steady-state value of 12V.

The algorithm 1 also provides for the rise of a second programming voltage Vpcx, to be applied to the j-th row in the matrix. This second voltage value, indicated in block 4, attains 7V as a steady state value.

At this time, according to the invention, a read/verify step 5 is carried out for the byte being programmed. Reading lasts approximately one hundred nanoseconds and can occur during the rise transient of the second programming voltage Vpcx.

This is followed by a test step 6 to determine whether the data contained in the byte being programmed contains pre-programmed bits. This check is performed individually for each of the bits. If this checks out favorably (Y), that is when each of the bits within the byte carry a value of "zero", the algorithm is interrupted. This is illustrated by the STOP terminal. On the other hand, if the byte being programmed does not contain zero-programmed bits, a program pulse is enabled as illustrated by block 7.

Thereafter, the number of program attempts is checked at the end of the program pulse through test block 8. If this check reveals a lower number than a predetermined value, the test checks out unfavorably (N), and the algorithm 1 cycle is resumed from a point ahead of block 4. Where the number of program attempts reaches the predetermined limit, an error signal FAIL is issued.

The method of this invention affords a number of advantages, the foremost of which is that no program pulse is applied to a previously written bit. Each bit of a given byte is checked on an individual basis, and a minimum number of program pulses is applied to the byte.

Thus, the cells in one bit line of the byte being programmed will be unstressed, even if the user utilizes the algorithm 1 incorrectly.

Overwriting an existing "zero" with another zero would still place no stress on the drain terminal of the involved memory cell.

Where an application only requires the incremental writing of a byte or a memory word, such as if the change in the informational contents of a byte is of the following type:

11111110→11111101→11111100, this can be done without entailing any problems of reliability.

Figure 2:
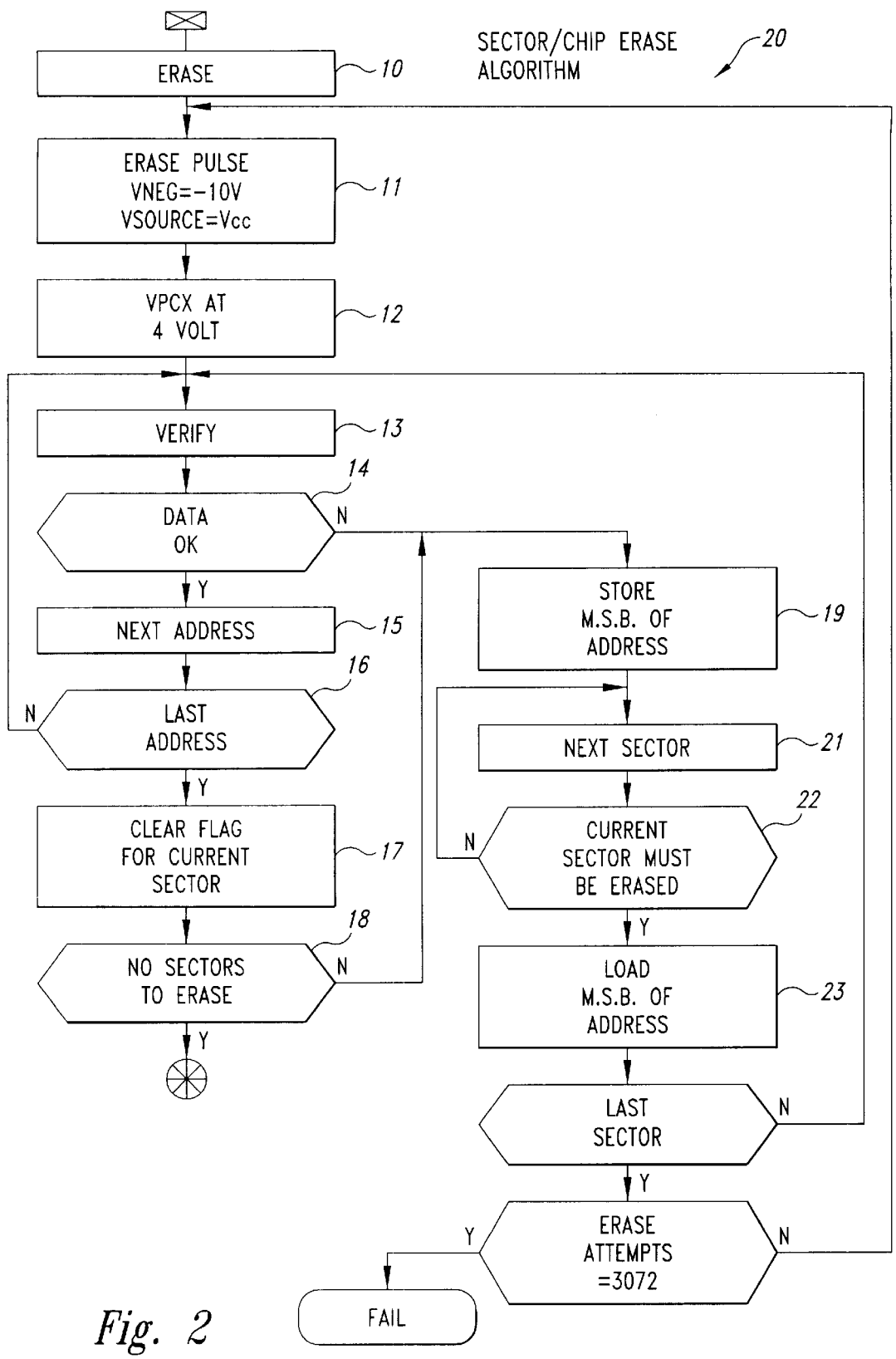
FIG. 2 a diagrammatic representation of an algorithm for implementing a multi-page erase mode in accordance with the method of this invention.

With reference to the example of FIG. 2, the manner how the resident erase algorithm 20 in the memory device evolves in operation according to the principles of the inventive method will now be discussed.

The erase algorithm of the invention starts with a parallel erase step 10 which may affect one or more sectors of the matrix memory. Accordingly, an erase pulse is enabled which brings the control gates of the memory cells to a negative voltage, Vneg, of about −10V, while the source terminals are applied a voltage, Vs, equal to the supply voltage Vcc.

This step is illustrated schematically by block 11. The algorithm 20 also provides for a rise in the drain voltage, Vpcx, to 4V. This is illustrated by block 12.

After the parallel erase step on some or all of the matrix sectors, it is verified that the erasing has actually occurred. Each sector is analyzed on an individual basis by storing each last byte verified into a sector. Once a sector is erased, no further erase pulses are applied to that sector.

Verify block 13, in fact, provides access to test block 14, where each byte of that particular sector is checked. If the bytes check out successfully (Y), the memory word address is incremented to the last word in the sector, as illustrated schematically by block 15. The testing of the last word is illustrated by block 16; if the test fails (N), the cycle is resumed from a point ahead of verify block 13.

Once the verification of a sector is completed, and the test 16 is passed (Y), a flag, block 17, is reset to increment the sector address. If there are no more sectors to be erased, a test 18 terminates the algorithm 20.

Advantageously, according to the invention, if the verify test 14 checks out unfavorably (N), that is if the erasing has been ineffective on the given byte, the address of the last byte checked within the sector being tested is stored in block 19. This storage may take place into a small read/write RAM memory, for example, not shown because conventional.

This storing step is carried out before a step 21 of sector address increment. If the new sector requires no erasing, the sector address is again incremented. All this is verified within test block 22.

The address of the byte of the sector that checked unsuccessfully is loaded after test block 22. This information is picked up by the aforementioned read/write memory. If this address does not correspond to the last sector, the verify step 13 is repeated.

If the address does correspond to the last sector, and the erase attempts made are still below a predetermined upper limit value, the step of erasing the last sector is repeated, starting with block 11. However, where the unsuccessful erase attempts have attained the predetermined limit value, an error signal FAIL is issued.

The algorithm 20 has a major advantage in that it avoids stressing the sectors that are to be erased.

Upon the erased condition of a sector being fully verified, i.e. upon the last address of that sector being erased, the sector is cut off from subsequent erase operations, and no more erase pulses are applied to that sector. Alternatively, when the verify step indicates that a given memory word in a given sector has been erased incorrectly, an erase and verification are performed again, starting with that particular sector rather than from the previous verify procedure.

Thus, the erase time is matched to the aging level of a given sector.

In addition, electrical noise from source erasing is effectively counteracted. Reliability is ensured, even if a user fails to observe the data sheet specifications.

Figure 3:
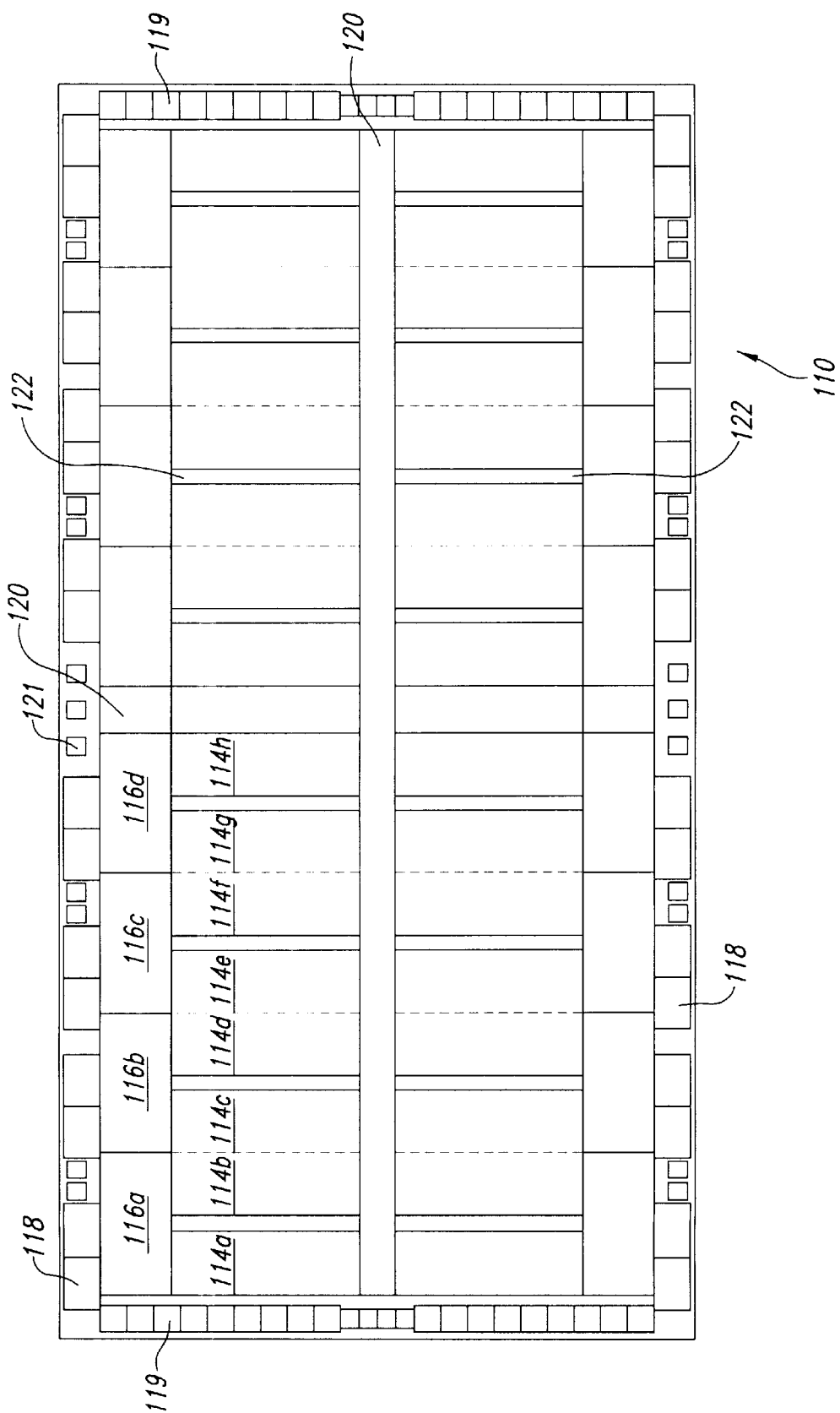
FIG. 3 illustrates an EEPROM memory according to the present invention.

As shown in FIG. 3, an integrated circuit memory device 110 includes a plurality of non-volatile memory cells arranged in sectors 114a–114h. Each sector has an array of memory cells arranged as a matrix. The non-volatile memory cells are of a type well known in the art, such as EEPROM cells, flash cells, or the like. The cells are programmable in byte mode under control of the peripheral circuitry 116 (labelled 116a–116d for selected sections). Programming in byte mode is well known in the art. A resident program algorithm is stored on the memory device at a convenient location, such as any one of sections 119, 120, or other locations. The chip is accessed by pads 118 and 121.

What is claimed is:

1. A method of programming a matrix of programmable memory cells divided into sectors made of columns and rows, and the matrix programmable in a byte mode, the method comprising:

determining if a matrix byte comprised of a set of the programmable memory cells of a particular sector of the matrix is to be programmed;

if the matrix byte is to be programmed with a data byte comprised of data bits, then:

raising a first connection line coupled to one of the set of memory cells in the matrix byte to a first programming voltage, raising a second connection line coupled to the one of the set of memory cells in the matrix byte to a second programming voltage; and for a selected one of the set of memory cells within the matrix byte, prior to applying a programming pulse that loads data, and during the same time the first or second connection line is being raised to its respective programming voltage:

reading the selected memory cell;

determining if the selected memory cell already stores a value that is equal to a corresponding data bit intended to be loaded into the selected memory cell; and if the selected memory cell does not store a value equal to the corresponding data bit, applying the programming pulse in order to write the corresponding data bit into the selected memory cell.

2. The method of claim 1 wherein the first programming voltage is 12 volts.

3. The method of claim 1 wherein the second programming voltage is 7 volts.

4. The method of claim 1 wherein the data byte comprises 16 data bits.

5. A method of programming a matrix of programmable memory cells divided into sectors made of columns and rows, each row including a matrix byte of a plurality of memory cells, and the matrix programmable in a byte mode, the method comprising:

for a selected matrix byte of the matrix, prior to applying a programming pulse that loads data into the memory cells of the selected matrix byte, raising respective programming voltages on the columns and row of the selected matrix byte;

selecting and reading a selected memory cell of the matrix byte while at least one of the programming voltages is being raised;

determining whether the selected memory cell already stores a value equal to a respective data bit to be loaded into the selected memory cell; and if the value stored in the selected memory cell is equal to the respective data bit, refraining from programming the selected memory cell.

6. The method of claim 5 further comprising:

if the value stored in the selected memory does not equal the respective data bit, programming the selected memory cell with the respective data bit.

7. The method of claim 6 further including:

after attempting to program the respective data bit into the selected memory cell, verifying that the respective data bit is stored in the selected memory cell.

8. The method of claim 1, further comprising:

repeating the procedure of:

raising the first and second connection lines to their respective programming voltages, reading the selected memory cell during the same time the first or second connection line is being raised to its respective programming voltage, determining if the selected memory cell already stores the value of the corresponding data bit, and applying the programming pulse in order to write the corresponding data bit into the memory cell if the memory cell does not store a value equal to the corresponding data bit;

until a halt signal is received.

9. The method of claim 5 wherein the halt signal is generated when all of the memory cells of the matrix byte contain the corresponding data bits that are to be written into them, respectively.

10. The method of claim 5 wherein the halt signal is generated when the procedure has been repeated a predetermined number of times.

* * * * *

UNITED STATES PATENT AND TRADEMARK OFFICE
CERTIFICATE OF CORRECTION

PATENT NO. : 6,195,290 B1  
DATED : February 27, 2001  
INVENTOR(S) : Marco Dallabora et al.

Page 1 of 1

It is certified that error appears in the above-identified patent and that said Letters Patent is hereby corrected as shown below:

Column 6, claim 9,
Line 46, "The method of claim 5" should read -- The method of claim 8 --.

Column 6, claim 10,
Line 50, "The method of claim 5" should read -- The method of claim 8 --.

Signed and Sealed this

Sixteenth Day of April, 2002

Attest:

JAMES E. ROGAN
*Director of the United States Patent and Trademark Office*

*Attesting Officer*